United States Patent [19]

Wu

[11] Patent Number: 4,578,590

[45] Date of Patent: Mar. 25, 1986

[54] CONTINUOUS ALIGNMENT TARGET PATTERN AND SIGNAL PROCESSING

[75] Inventor: Frederick Y. Wu, Cos Cob, Conn.

[73] Assignee: The Perkin-Elmer Corporation, Norwalk, Conn.

[21] Appl. No.: 490,614

[22] Filed: May 2, 1983

[51] Int. Cl.⁴ .................................................. G01N 21/86
[52] U.S. Cl. ..................................... 250/548; 356/400
[58] Field of Search ................. 250/548, 557, 237 G; 356/138, 396, 400, 401, 399

[56] References Cited

U.S. PATENT DOCUMENTS

| | | | |
|---|---|---|---|
| 4,252,442 | 2/1981 | Dandliker et al. | 356/400 |
| 4,301,363 | 11/1981 | Suzuki et al. | 250/548 |
| 4,408,885 | 10/1983 | Johannsmeier et al. | 250/548 |

*Primary Examiner*—David C. Nelms
*Attorney, Agent, or Firm*—Thomas P. Murphy; Edwin T. Grimes; Francis L. Masselle

[57] ABSTRACT

The present invention is directed to a combination of elements for use in an alignment system for a scanning mask aligner, which include a viewing system having an optical grid, apparatus for moving the mask and wafer alignment patterns across the optical grid, each pattern having front edge portions displaced with respect to rear edge portions in the direction of scanning so that only light corresponding to a plurality of said front edge portions is transmitted through the grid at one time and only light corresponding to a plurality of the rear edge portions being transmitted through the grid at a second later period of time, the grid corresponding to the directions and spacing of the pattern so that light transmitted through the grid is strongly modulated, and circuitry responsive to the transmitted light operative to output alignment signal errors.

7 Claims, 11 Drawing Figures

CONTINUOUS ALIGNMENT TARGET PATTERN AND SIGNAL PROCESSING

FIELD OF INVENTION

This invention relates to the field of microlithography and, more particularly, to alignment systems for scanning mask aligners. The system according to the present invention is particularly adapted, among other uses, for use with a step and scan microlithography projection system.

This case is closely related to and assigned to the same assignee as U.S. patent application entitled "Alignment and Focusing System For A Scanning Mask Aligner" by D. A. Markle, filed on Dec. 21, 1982, and bearing Ser. No. 451,900. The disclosure contained therein is incorporated in the present case by reference.

BACKGROUND OF INVENTION

This application is intended as an improvement over the alignment systems of the above-referenced Markle patent application. As described in the earlier Markle disclosure, periodic patterns on a mask and wafer can be used to perform automatic fine alignment in a scanning projection mask aligner during the scanning operation. However, in certain installations, particularly where the illumination of the target imprinted on the wafer is non-uniform in the angle of incidence, the alignment technique is sensitive to line width.

SUMMARY OF INVENTION

The target and system proposed in the present invention aims to substantially eliminate line width effects, and simultaneously increase the capture range of the alignment system.

Briefly, the present invention is directed to a combination in an alignment system for a scanning mask aligner employing a pattern on the mask or the wafer or both in the scribe lines that run in the direction of scan, that comprises a viewing system having optical grid means, means for moving the patterns across the optical grid means in the viewing system, the grid means corresponding to the directions and spacings of the patterns so that light transmitted through the grid means is strongly modulated, means for comparing the phase modulation from the mask and wafer alignment targets to obtain alignment error signals, characterized by the improvement wherein the wafer pattern has a first edge type and a second edge type and means are provided for separately detecting the first edge type and the second edge type. According to one aspect of the invention, the means for separately detecting the two edge types include means for alternately detecting the first edge type and the second edge type.

According to another aspect of the invention, the wafer pattern is a zig-zag pattern and the first edge type is on the opposite side of the second edge type and the first edge type is staggered with respect to the second edge type in the direction of scanning, whereby light from only one edge type is transmitted through the grid means at any one time. The mask pattern is the same as in the aforementioned patent application Ser. No. 451,900.

According to still another feature of the invention, means are provided for altering the light transmitted to make the edge types substantially equally bright.

There has thus been outlined rather broadly the more important features of the invention in order that the detailed description thereof that follows may be better understood, and in order that the present contribution to the art may be better appreciated. There are, of course, additional features of the invention that will be described hereinafter which will form the subject of the claims appended thereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention. Specific embodiments of the invention have been chosen for purposes of illustration and description, and are shown in the accompanying drawings, forming a part of the specification.

DETAILED DESCRIPTION OF THE INVENTION

Figure 1:
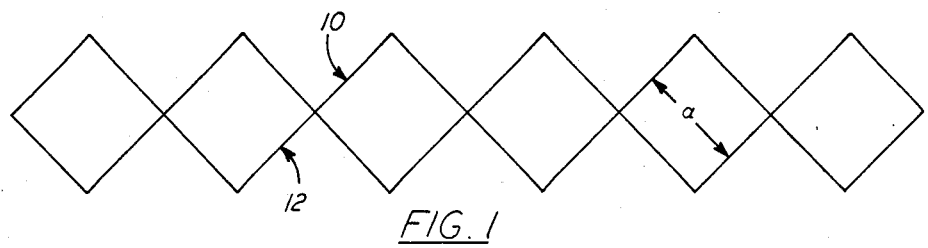
FIG. 1 is a view of a mask or wafer alignment pattern according to the prior art.
Figure 2:
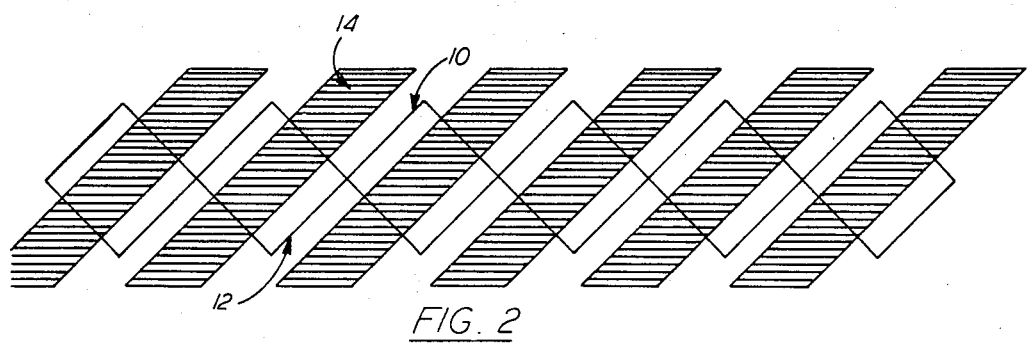
FIG. 2 is a view showing a particular relative position of the grid and the prior art alignment pattern showing how light from the edges of the wafer pattern is modulated by a grating of similar orientation.

As described in the aforementioned Markle patent application, periodic patterns on a mask and wafer can be used to perform automatic fine alignment in a scanning projection mask aligner during the scanning operation. The wafer target proposed was a "chain of diamonds" as illustrated in FIG. 1 of the present application. A periodic optical signal was obtained when the target was illuminated. Its image was observed through a transmission grating, having a 50% duty cycle, FIG. 2, while the target was moved at constant velocity in the scan direction with respect to the fixed grating.

Since in general a wafer target is a relief object, the edges such as the ones indicated at 10 and 12 in FIG. 1 face or slope in different directions and scatter light differently. Also, if the pattern undergoes a line width change due to wafer processing, the edges 10 and 12 move in opposite directions, corresponding to expansion or shrinkage of the diamonds. If the edges are equally bright, then there is no phase shift of the periodic signal detected through the grating 14 in FIG. 2 when the two types of edges are advanced with respect to the grating. However, since the two types of edges behave differently optically, non-uniform illumination or differences in edge slopes can result in different brightness for the two types of edges. Even with uniform illumination, the edges could have unequal brightness if their slopes are not equal in magnitude. This leads to a line width dependent phase shift, or misalignment.

Figure 3:
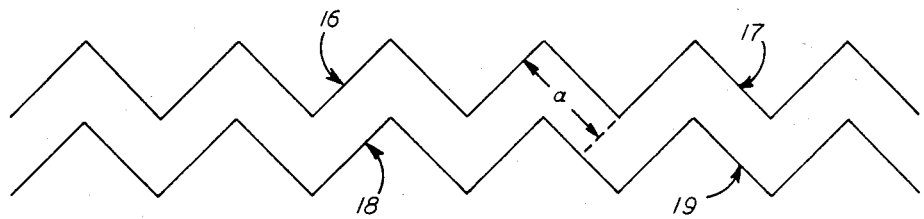
FIG. 3 is a view of a wafer alignment pattern according to the present invention.
Figure 4:
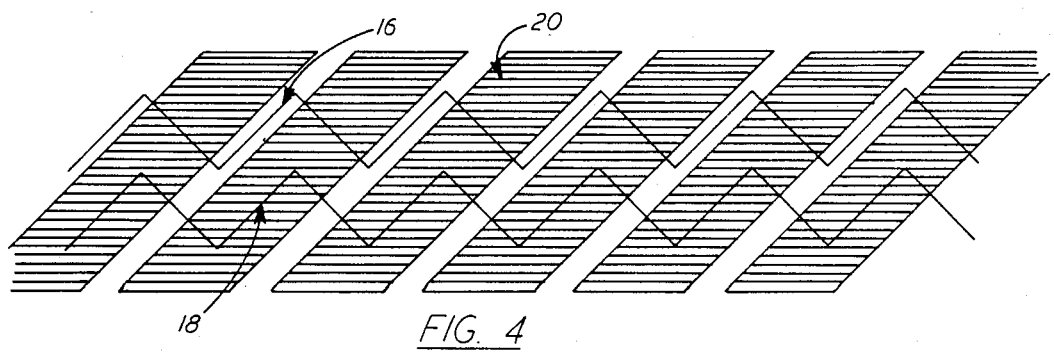
FIG. 4 is a view showing a particular relative position of the grid and alignment pattern of the present invention showing how light from the edges of the wafer pattern is modulated by a grating of similar orientation.
Figure 5:
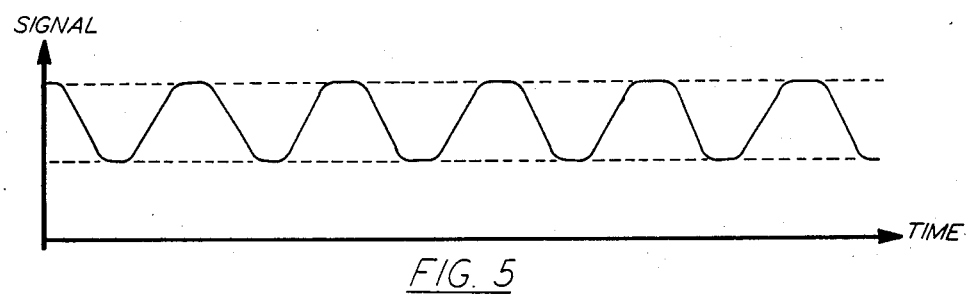
FIG. 5 is a graphic representation of the waveforms of the optical signals when the edges of the alignment pattern are equally bright.
Figure 6:
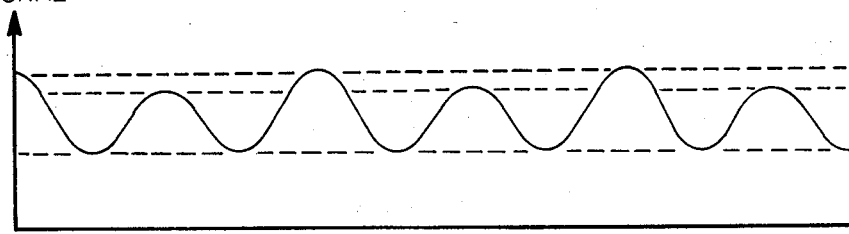
FIG. 6 is a graphic representation of the waveforms of the optical signals when the edges of the alignment patterns are of very different brightness.
Figure 7:
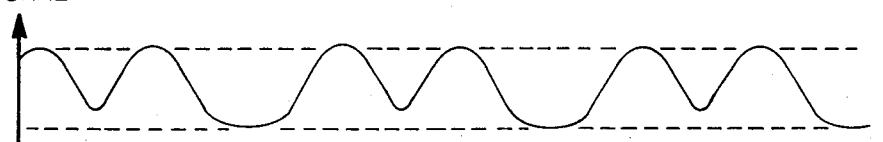
FIG. 7 is a graphic representation of the waveforms of the optical signals when the illumination has been altered to make the edges of the alignment pattern equally bright, but the edges are not equally spaced due to departure of wafer target linewidths from their nominal values.

A target pattern according to the present invention is illustrated in FIG. 3. It has two edge types 16 and 18 positioned so that when observed through a grating 20, FIG. 4, only one edge type is detected at any one time. The grating has a 25% transmission duty factor, and as the target scans, alternately edge type 16 and edge type 18 are observed. If the target dimensions are the nominal values and if the edges are equally bright, the optical signal looks as illustrated in FIG. 5 as the target scans. If the edges are of very different brightness, then the waveform looks as illustrated in FIG. 6 as the target scans. This signal has information indicating unequally bright edges. This data can be used in a number of ways to reduce line width sensitivity, e.g., the illumination could be altered to make the edges equally bright, as will be discussed more fully hereinafter. If this were done, then the line width variation would result in waveforms as illustrated in FIG. 7. The latter waveform is a periodic signal with a correct average phase, but has a phase "jitter" that is a result of the line width variation. Such a phase jitter occurs at high frequency (one-half the fundamental) and probably is not a problem for the alignment servo, which does not respond to such frequencies. If it is not practical to make the edges equally bright, then some sophisticated processing could eliminate the combined effects of unequal edge brightness and line width variation.

The capture range of an alignment system based upon a periodic target is ± one-half the period. With the wafer target of FIG. 1 and a mask target with period "a", the capture range is ±½"a". If the new wafer pattern has dimension "a" as shown in FIG. 3, and if the two edge types, 16, 18, are of equal brightness, then the period is ½"a", yielding a reduced capture range of ±¼"a". However, when desired, it may be possible to make the signal generated by each edge type very different in magnitude. For example, in a darkfield illuminated system, one could intentionally make the illumination very non-uniform in angle of incidence, thus accentuating one type of edge over the other. Conversely, in a bright-field system, one could make the collection angular spread asymmetric with the same result. This restoration of the capture range to ±½"a" would most likely be useful at the start of a wafer, just after transfer of control from intermediate alignment—a moment when a large capture range is most needed. Subsequent subfields could be aligned with the normal ±¼"a" capture range.

The use of a wafer target with a smaller period, ½"a", could improve the alignment resolution under certain conditions. One case in which it would not is the signal-to-noise limited case, in which only increasing the illumination intensity or the length of target edges under view would help. The new target contains the same quantity of edges as the diamond pattern, and so each maximum of the new target has only half the signal of the diamond target. There is an improvement if the resolution with which the phase can be measured is a fixed fraction of the period, since the new pattern has a smaller period.

Figure 8:
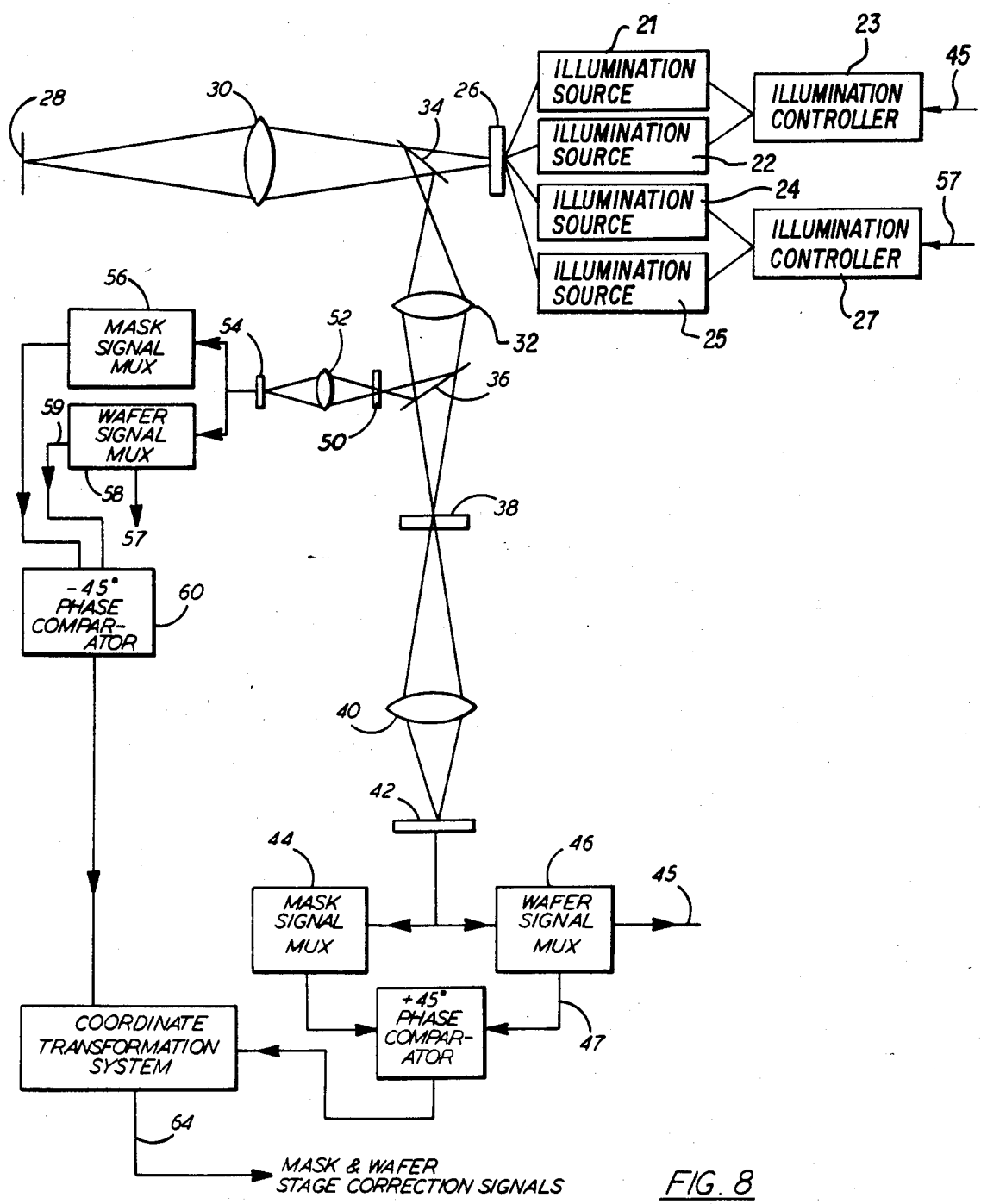
FIG. 8 is a schematic diagram showing a projection system and an alignment system.

A schematic representation of one form of the alignment system is shown in FIG. 8 wherein illumination sources are indicated at 22 and 24. Illumination source 22 serves to illuminate the pattern edge type 16 and the illumination source 24 serves to illuminate the pattern edge 18 of FIG. 3. The illumination is focused on a mask 26. The mask pattern is imaged on a wafer 28, by a projection system indicated generally at 30. The wafer acts as a mirror of the mask image so that the mask is re-imaged and the wafer is imaged into a focal plane of a relay lens means, 32, via a beam splitter 34 in the projection system. A second beam splitter 36 behind the relay lens splits the relayed image into two components so that two grids can be used, one oriented at +45° and the other at −45°. Thus, one component includes a +45° grid 38, a lens system 40 and a detector array 42. The appropriate detector to sense the mask and wafer signals is selected by a multiplexer, i.e., a mask signal MUX 44 and a wafer signal MUX 46. From the wafer signal MUX 46, a signal output 45 proportional to the degree of modulation at half the fundamental frequency is generated. In the case of FIG. 5, this signal would be zero, whereas in the case of FIG. 6, it would be significantly different from zero. This signal is a measure of the difference in brightness of the two edge types 16 and 18, and can be used to make the edge types equally bright by controlling the illumination sources 21 and 22, through the illumination controller 23. Then the wafer MUX output 47 is modulated at the fundamental frequency and not at half the fundamental frequency. MUX 44 output and the output 47 are fed into the +45° phase comparator 48. The other component from the beam splitter 36 is reflected to a −45° phase grid 50, a lens system 52 and a detector 54. The appropriate detector to sense the mask and wafer signals is selected by a multiplexer, i.e., a mask signal MUX 56 and a wafer signal MUX 58. From the wafer signal MUX 58, a signal output 57 proportional to the degree of modulation at half the fundamental frequency is generated. This signal is a measure of the difference in brightness of the two edge types 17 and 19, shown in FIG. 3, and can be used to make the edge types equally bright by controlling the illumination sources 24 and 25, through illumination controller 27. Then the wafer MUX output 59 is modulated at the fundamental frequency and not at half the fundamental frequency. MUX 56 output and the output 59 are fed into the −45° phase comparator 60. The outputs from the two phase comparators 48, 60 correspond to alignment errors in the directions normal to the corresponding optical grids of +45° and −45°. These signals are readily converted into X and Y or 0° and 90° alignment signals in a coordinate transformation system 62, which outputs mask and wafer stage correction signals 64. These signals are measures of mask and wafer alignment in the directions parallel and perpendicular to the scan direction.

Figure 9:
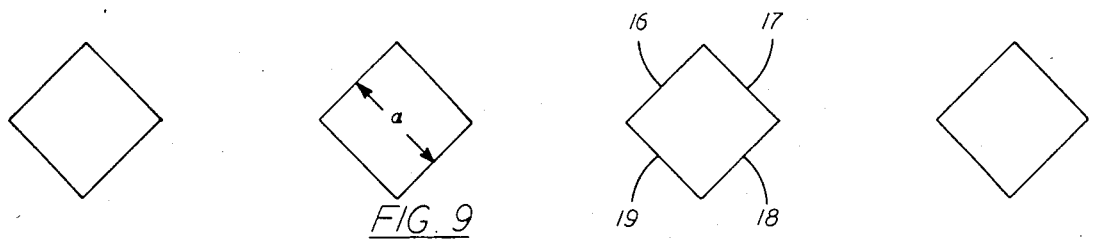
FIGS. 9, 10 and 11 are views of alternate wafer patterns according to the present invention.
Figure 10:
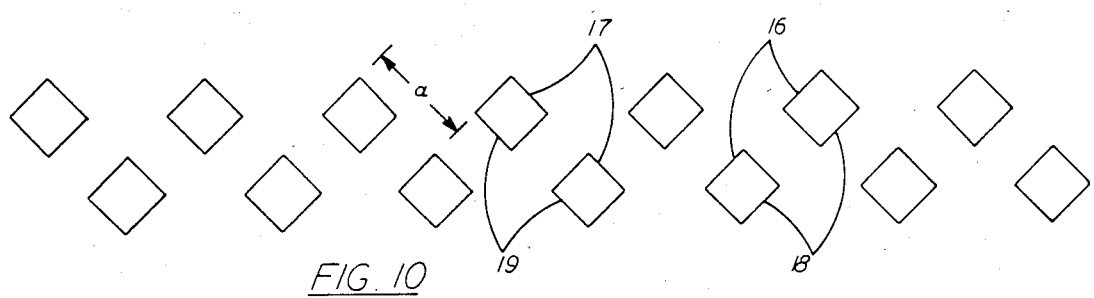
Figure 11:
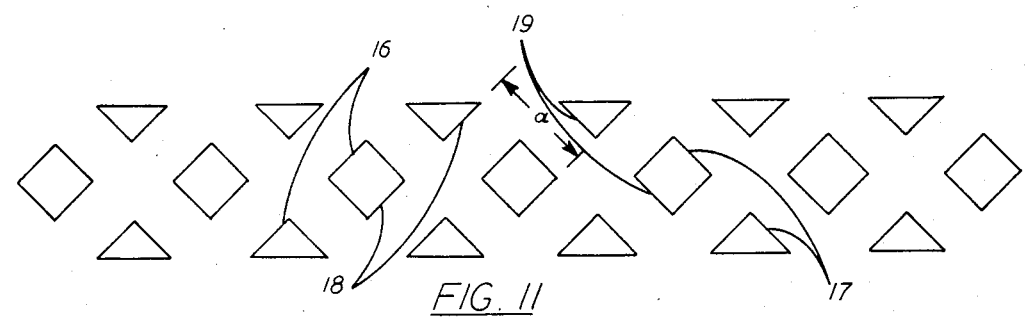

Alternate target geometries or patterns which allow distinct detection of two edge types are shown in FIGS. 9, 10 and 11. When the two edge types are equally bright, then their capture ranges are ±½a, ±¼a, and ±¼a, respectively. These targets have the same overall height—√2a. In other words, they all would occupy the same amount of scribe alley area. Many other targets with these characteristics undoubtedly could be found.

It will thus be seen that the present invention does indeed provide an improved continuous alignment target pattern and signal processing system in which the alignment target that is imprinted on the wafer has been designed to allow separate detection of the edges on the opposite sides of the target. Such separate detection allows detection of and correction for unequal brightness of the edges on opposite sides of the target, while simultaneously increasing the capture range of the alignment system. Although specific embodiments have been illustrated and described, it will be obvious to those skilled in the art that various modifications may be made without departing from the spirit and scope of the invention which is to be limited solely by the appended claims.

What is claimed is:

1. In an alignment system for a scanning mask aligner employing continuous alignment patterns on a mask and continuous alignment patterns on a wafer in the scribe lines that run in the direction of scan, the combination comprising a viewing system having optical grid means, means for moving the patterns across said optical grid means in the viewing system, said mask patterns and said wafer patterns each having front edge portions and rear edge portions respectively, said front edge portions being displaced with respect to said rear edge portions in the direction of scanning so that only light corresponding to a plurality of said front edge portions is transmitted through said grid means during one period of time and only light corresponding to a plurality of said rear edge portions is transmitted through said grid means during a second later period in time, said grid means corresponding to the directions and spacings of the patterns so that light transmitted through the grid means is strongly modulated, and means responsive to said transmitted light operative to output alignment error signals.

2. A system according to claim 1, wherein said mask and wafer patterns are zig-zag-like shaped and have a predetermined width, and the front and rear edges of said pattern have the same slope and are disposed on opposite sides of the width of the pattern.

3. A system according to claim 1, wherein said mask and wafer patterns are in the form of a plurality of spaced diamond-shaped blocks.

4. A system according to claim 1, further comprising means for illumination alteration so as to make said front edge portions and said rear edge portions equally bright.

5. A system according to claim 1, wherein said optical grid means includes a pair of optically orthogonally diagonal optical grids, said grids consisting of parallel lines.

6. A system according to claim 1, wherein said optical grid means includes a first grid having about a +45° pattern and a second grid having about a −45° pattern with respect to the scanning direction.

7. A system according to claim 1, wherein said means responsive to said transmitted light includes multiple detectors on which the mask and wafer patterns are imaged separately.

* * * * *